United States Patent [19]
Kim

[11] Patent Number: 5,982,685
[45] Date of Patent: Nov. 9, 1999

[54] SEMICONDUCTOR DEVICE FOR TEST MODE SETUP

[75] Inventor: Dong Gyeun Kim, Chungcheongbuk-do, Rep. of Korea

[73] Assignee: LG Semicon Co., Ltd., Chungcheongbuk-Do, Rep. of Korea

[21] Appl. No.: 09/154,826

[22] Filed: Sep. 17, 1998

[30] Foreign Application Priority Data

Mar. 4, 1998 [KR] Rep. of Korea ............ 98-7103

[51] Int. Cl.⁶ .................................................. G11C 8/00
[52] U.S. Cl. ................................ 365/201; 365/230.06
[58] Field of Search ................. 365/201, 230.06, 365/189.12

[56] References Cited

U.S. PATENT DOCUMENTS

| | | | |
|---|---|---|---|
| 4,860,259 | 8/1989 | Tobita | 365/201 |
| 5,381,373 | 1/1995 | Ohsawa | 365/201 |
| 5,781,485 | 7/1998 | Lee et al. | 365/201 |
| 5,825,782 | 10/1998 | Rodhparvar | 365/201 |
| 5,883,843 | 3/1999 | Mii et al. | 365/201 |
| 5,905,690 | 5/1999 | Sakurai et al. | 365/201 |

*Primary Examiner*—Tan T. Nguyen
*Attorney, Agent, or Firm*—Morgan, Lewis & Bockius LLP

[57] ABSTRACT

A semiconductor device for a test mode setup is disclosed, which allows an SDRAM user to prevent an unwanted test mode from being set up. The semiconductor device for a test mode setup includes a command decoder for outputting a first address signal through a plurality of input signals, a shift register for outputting a second address signal, a logic part for outputting a test register setup signal by combining the first address signal with the second address signal, a test register for storing the test register setup signal, and a test decoder for outputting a test mode signal in response to the test register setup signal stored in the test register.

8 Claims, 4 Drawing Sheets

SEMICONDUCTOR DEVICE FOR TEST MODE SETUP

BACKGROUND OF THE INVENTION

1. Field of the Invention

The present invention relates to a test mode setup, and more particularly, to a semiconductor device for a test mode setup which allows a synchronous DRAM (SDRAM) user to prevent an unwanted test mode from being set up.

2. Discussion of the Related Art

A conventional semiconductor device for a test mode setup will be described with reference to the accompanying drawings.

FIG. 1 is a block diagram illustrating a conventional semiconductor device for a test mode setup. FIG. 2 is a timing chart illustrating a setup operation of a conventional semiconductor device for a test mode setup.

As shown in FIG. 1, the conventional semiconductor device for a test mode setup includes a command decoder 1, a test register 2, and a test decoder 3. The command decoder 1 decodes external input signals, i.e., a clock (CLK) signal, a row address strobe bar (RASB) signal, a column address strobe bar (CASB) signal, a chip select bar (CSB) signal, a write enable bar (WEB) signal, and a seventh address (A<7>) signal. The test register 2 stores a logic value of test decoding address TDA<i:j> signal of K-bit in response to a test register setup (TRS) signal decoded from the command decoder 1, and outputs a TDG<i:j> signal to the test decoder 3. The test decoder 3 outputs a test mode signal corresponding to the output TDG<i:j> of the test register 2.

The setup operation of the conventional semiconductor device for a test mode setup will be described below.

As shown in FIG. 2, the test mode is set up when the CLK signal repeats low and high in turn, a clock enable (CKE) signal is high in n−1 clock period, the A<7> signal is high in n clock period, the CSB signal, the RASB signal, the CASB signal and the WEB signal are low in n clock period, and the TDA<i:j> has a given logic value. In other words, the test mode setup is performed in such a manner that a test mode is operated if a logic value of the A<7> signal input during setting the test register is "1", while a normal mode is operated if the logic value is "0".

As shown in FIGS. 1 and 2, the command decoder 1 outputs the TRS signal of high level to the test register 2 when the inputs CLK, RASB, CASB, CSB, WEB, and A<7> of the command decoder 1 have the logic values as described above. When the TRS signal is high, the logic value of the TDA<i:j> signal of K bit is stored in the test register 2. There is the probability of $\frac{1}{2}^5$ that the command decoder 1 outputs the TRS signal of high level.

As aforementioned, the logic value of the TDA<i:j> signal is stored in the test register 2 when the TRS signal is high. The TRS signal is maintained at high pulse for a certain time period and then becomes low. When the TRS signal is low, the logic value previously stored in the test register 2 is maintained as it is even though the logic value of the TDA<i:j> signal is varied.

After the logic value of the TDA<i:j> signal is stored in the test register 2, the test register 2 outputs the TDG<i:j> signal to the test decoder 3. The test decoder 3 outputs the test mode signal corresponding to the logic value input thereto. At this time, the test mode signal is high.

The conventional semiconductor device for a test mode setup has a problem that an unwanted test mode setup may occur because the command decoder has the same logic values as those of a mode register set (MRS) which is one of combinations of synchronous DRAM commands, except for the logic value of the A<7>.

SUMMARY OF THE INVENTION

Accordingly, the present invention is directed to a semiconductor device for a test mode setup that substantially obviates one or more of the problems due to limitations and disadvantages of the related art.

An object of the present invention is to provide a semiconductor device for a test mode setup which allows an SDRAM user to prevent an unwanted test mode from being set up.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor device for a test mode setup according to the present invention includes a command decoder for outputting a first address signal through a plurality of input signals, a shift register for outputting a second address signal, a logic part for outputting a test register setup signal by combining the first address signal with the second address signal, a test register for storing the test register setup signal, and a test decoder for outputting a test mode signal in response to the test register setup signal stored in the test register.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

In the present invention, there are additionally provided a shift register and a logic part to store "0" bit addresses m times in series and generate a test register setup (TRS) signal for a test mode setup command, so as to reduce the probability of an unwanted test mode setup.

Figure 1:
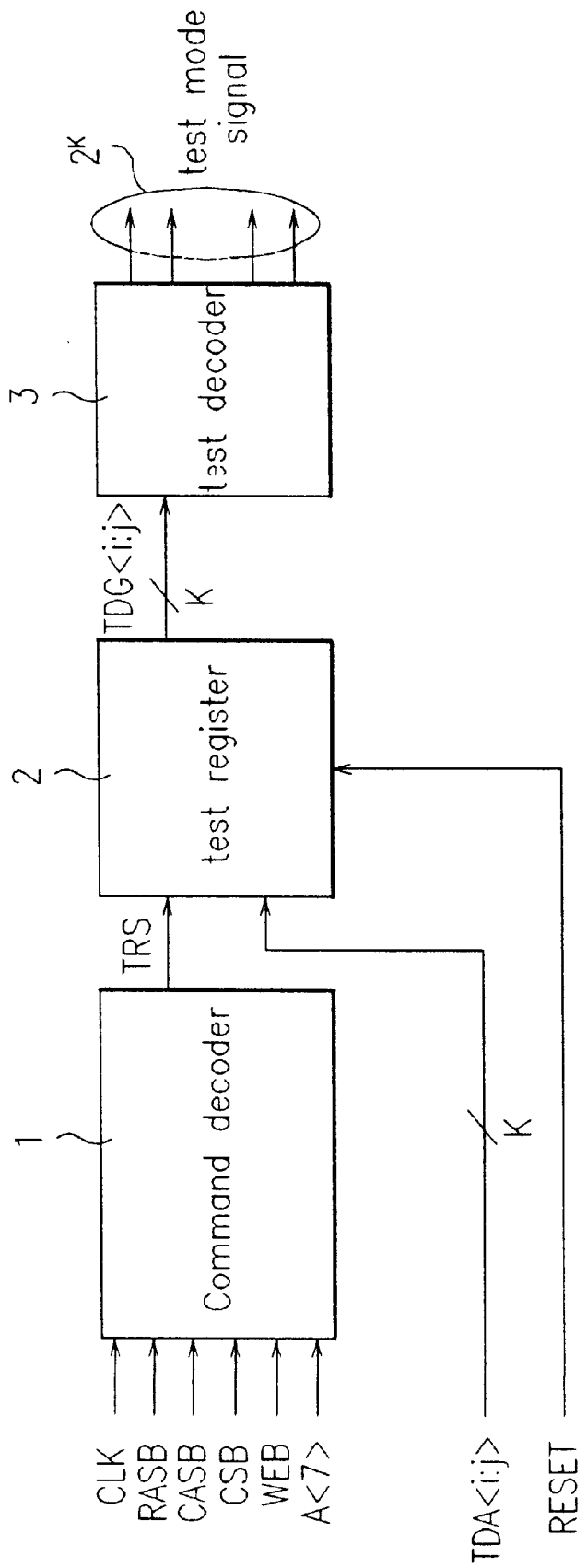
FIG. 1 is a block diagram illustrating a conventional semiconductor device for a test mode setup.
Figure 2:
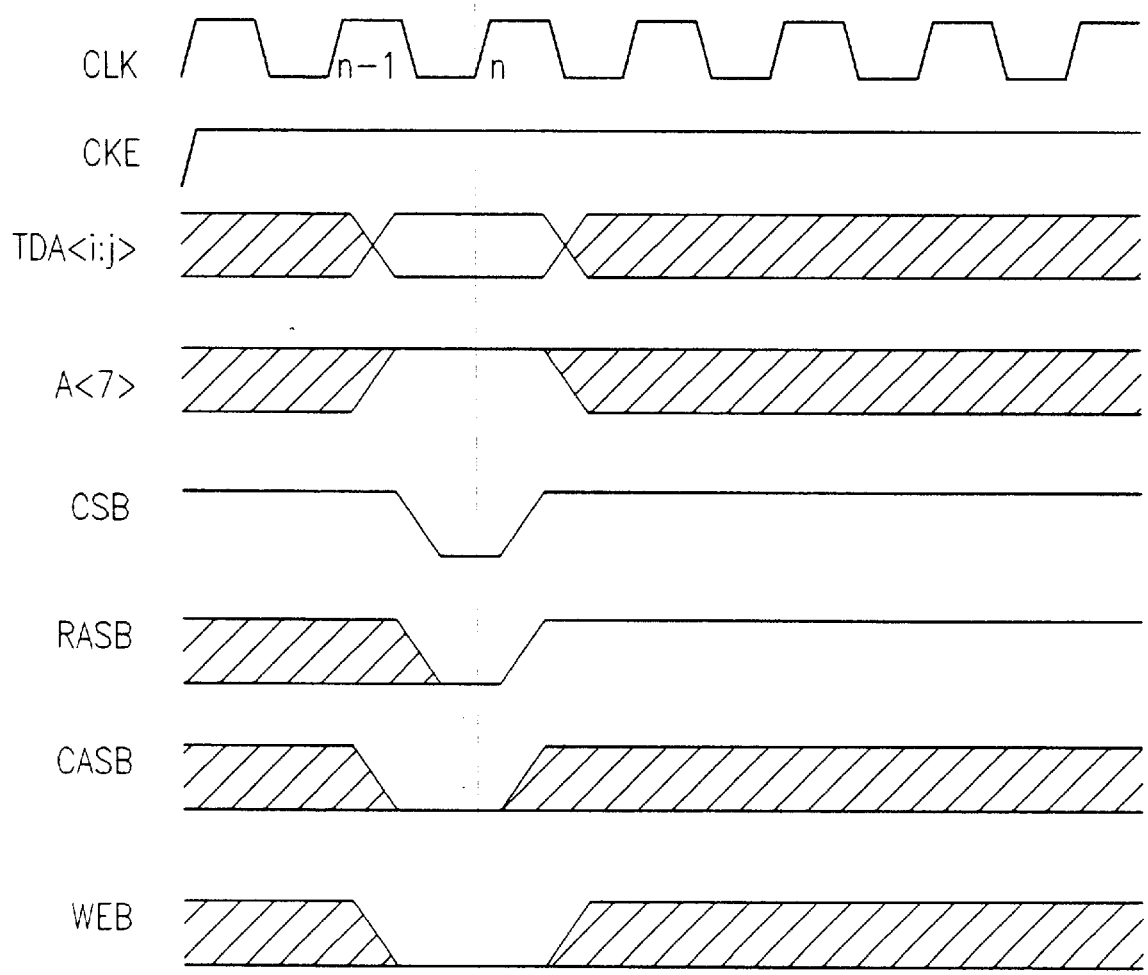
FIG. 2 is a timing chart illustrating a setup operation of a conventional semiconductor device for a test mode setup.
Figure 3:
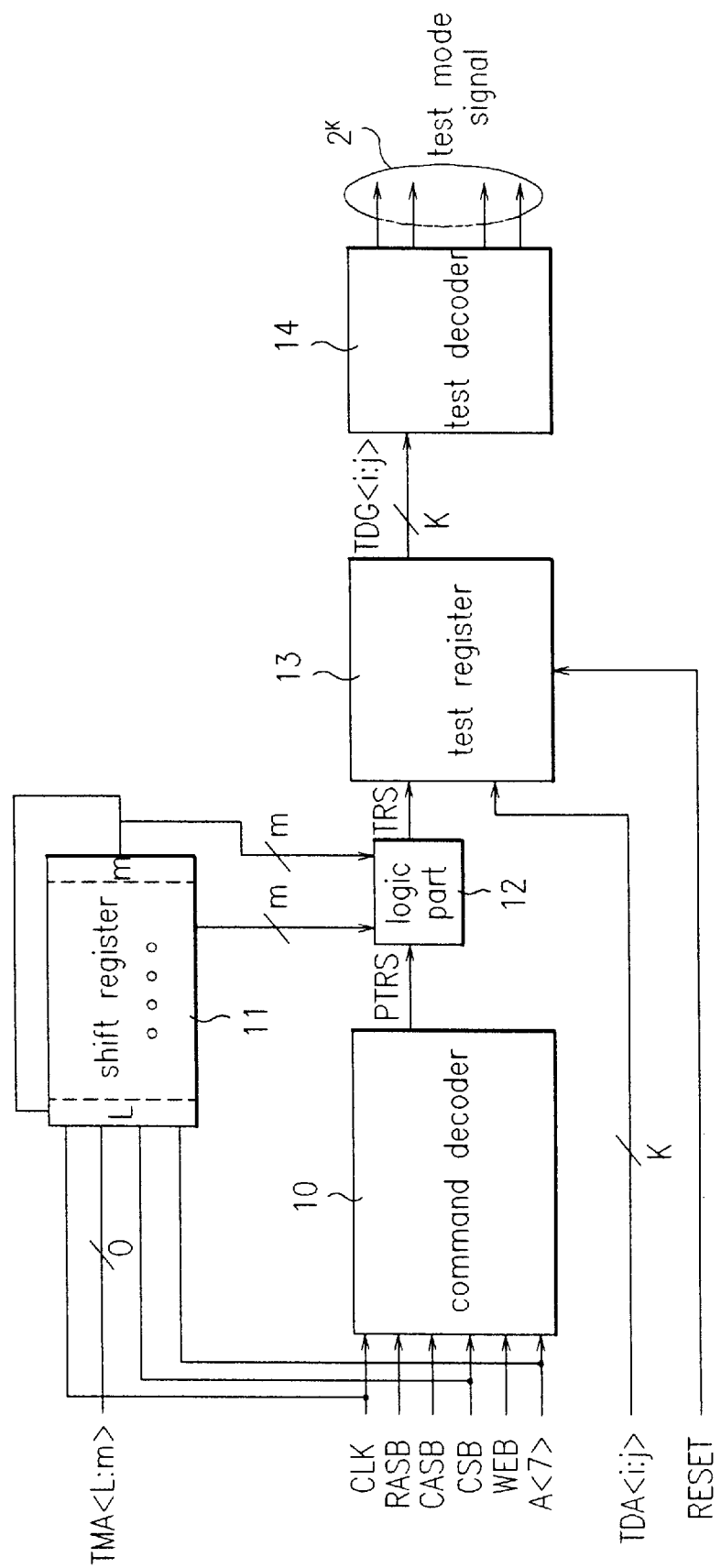
FIG. 3 is a block diagram illustrating a semiconductor device for a test mode setup according to the present invention.

As shown in FIG. 3, a semiconductor device for a test mode setup according to the present invention includes a command decoder 10, a shift register 11, a logic part 12, and a test register 13. The command decoder 10 decodes external input signals, i.e., clock (CLK) signal, a row address strobe bar (RASB) signal, a column address strobe bar (CASB) signal, a chip select bar (CSB) signal, a write enable bar (WEB) signal, and a seventh address (A<7>) signal. The shift register 11 stores a test mode address TMA<1:m> signal of "0" bit for m clock period when the CSB signal is low for m clock period or more. When the input signals A<7>, CSB, RASB, and WEB of the command decoder 10 have given logic values, the command decoder 10 outputs a protest register setup (PTRS) signal to the logic part 12. The logic part 12 outputs a TRS signal to the test register 13 if the address of the shift register is a desired address. The test register 13 stores logic values of a test decoding address (TDA<i:j>) signal of K bit in response to the TRS signal output from the logic part 12, and outputs a TDG<i:j> signal from the logic values stored therein to the test decoder 14. The test decoder 14 outputs a test mode signal corresponding to the logic value of the TDG<i:j> signal.

The setup operation of the semiconductor device for a test mode setup according to the present invention will be described below.

Figure 4:
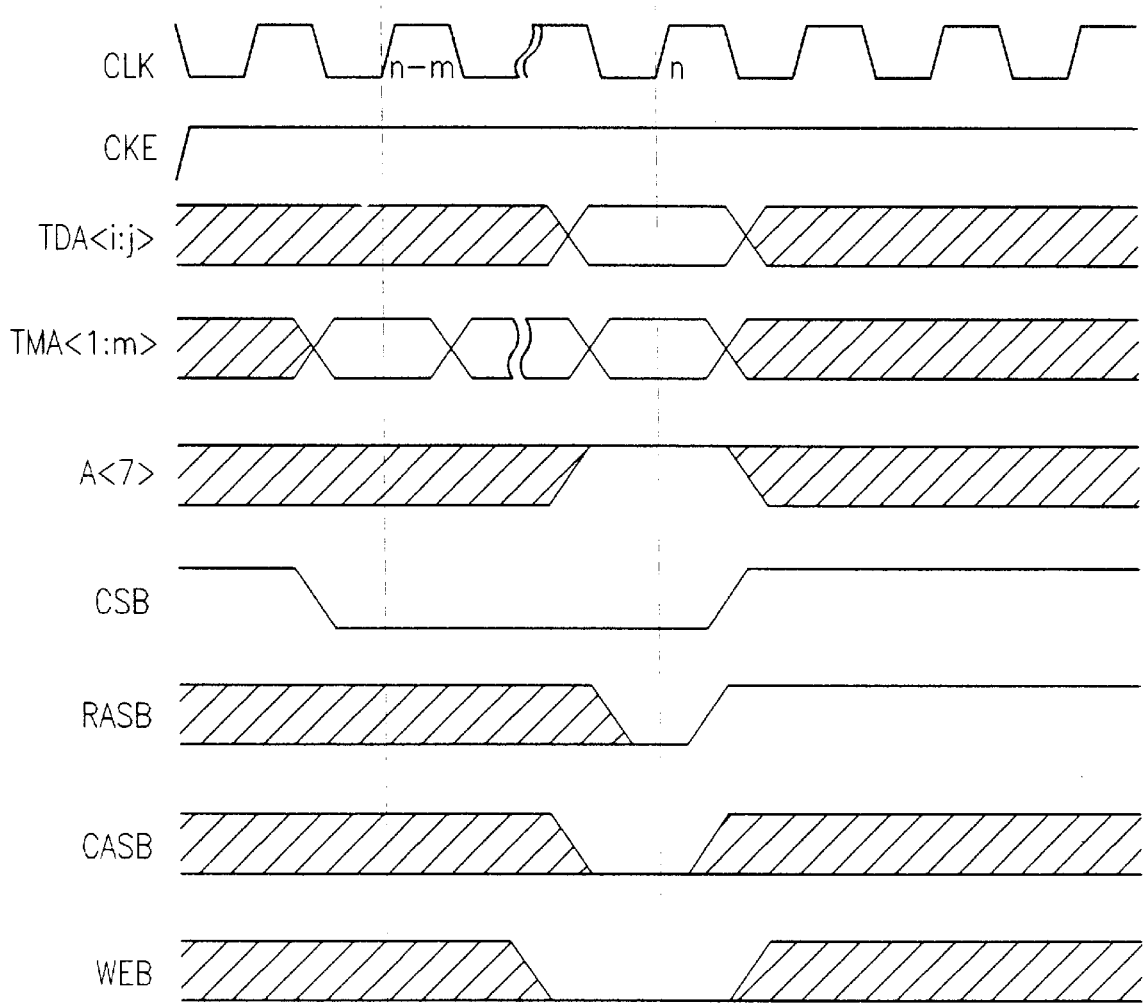
FIG. 4 is a timing chart illustrating a setup operation of a semiconductor device for a test mode setup.

As shown in FIGS. 3 and 4, all the operation occurs at high edge. The test mode is set up when the clock signal CLK of the command decoder 10 repeats low and high in turn, a clock enable (CKE) signal is high in n−1 clock period, the A<7> signal is high in n clock period, the CSB signal, the RASB signal, the CASB signal and the WEB signal are low in n clock period, and the TDA<i:j> has a given logic value.

In the test mode setup operation according to the present invention, the CSB signal is maintained at low level for m clock period or more (a plurality of clocks or more). While the CSB signal is maintained at low level, the TMA<1:m> signal of "0" bit is applied to the shift register 11 for m clock period. Then, the shift register 11 sequentially stores the TMA<1:m> signal of "0" bit. However, if the CSB signal becomes high, the TMA<1:m> signal is not stored in the shift register 11.

On condition that the CLK signal of the command decoder 10 repeats low and high in turn, the CKE signal is high in n−1 clock period, and the CSB signal, the RASB signal, the CASB signal and the WEB signal are low in n clock period, if the A<7> signal becomes high in nth clock period, the TMA<1:m> signal stored in the shift register 11 are transferred to the logic part 12 in parallel per bit. When the TMA<1:m> signal is transferred to the logic part 12, the command decoder 10 outputs the PRTS signal of high level to the logic part 12. The logic part 12 outputs the TRS signal of high level to the test register 13 if the addresses from the shift register 11 are designated addresses. Then, the test register 13 stores the logic value of the TDA<i:j> signal. The TDG<i:j> signal having the same logic value as the TDA<i:j> signal is transferred to the test decoder 14 to generate a desired test mode signal. As a result, the test mode is enabled.

The semiconductor device for a test mode setup according to the present invention has the following advantages.

Since there are provided the logic part and the shift register which stores "0" bit addresses m times in series before the TRS signal for the test mode setup command is generated, it is possible to reduce the probability of an unwanted test mode setup as much as $\frac{1}{2}^m \times $"0" bit as compared with the conventional device. As a result, the SDRAM user can prevent the unwanted test mode from being set up.

It will be apparent to those skilled in the art that various modifications and variations can be made in the semiconductor device for a test mode setup according to the present invention without departing from the spirit or scope of the invention. Thus, it is intended that the present invention covers the modifications and variations of the invention provided they come within the scope of the appended claims and their equivalents.

What is claimed is:

1. A semiconductor device for a test mode setup comprising:

a command decoder for outputting a first address signal through a plurality of input signals;

a shift register for outputting a second address signal;

a logic part for outputting a test register setup signal by combining the first address signal with the second address signal;

a test register for storing the test register setup signal; and a test decoder for outputting a test mode signal in response to the test register setup signal stored in the test register.

2. The semiconductor device for a test mode setup as claimed in claim 1, wherein the plurality of input signals includes external signals, i.e., a clock (CLK) signal, a row address strobe bar (RASB) signal, a column address strobe bar (CASB) signal, a chip select bar (CSB) signal, a write enable bar (WEB) signal, and a designated address signal.

3. The semiconductor device for a test mode setup as claimed in claim 1, wherein the first address signal is output when the RASB signal, the CASB signal, the CSB signal, and the WEB signal are low and the designated address signal is high.

4. The semiconductor device for a test mode setup as claimed in claim 1, wherein the shift register includes common input signals consisting of the CLK signal, the CSB signal, and the designated address signal together with an additional test mode address signal.

5. The semiconductor device for a test mode setup as claimed in claim 4, wherein the test mode address signal is input to the shift register when the CSB signal is low.

6. The semiconductor device for a test mode setup as claimed in claim 1, wherein the second address signal is input to the logic part in parallel.

7. The semiconductor device for a test mode setup as claimed in claim 1, wherein the test mode setup signal is determined by outputting the first address signal when the second address signal is a designated address signal.

8. The semiconductor device for a test mode setup as claimed in claim 1, wherein the test register includes an input signal, i.e., a test decoding address signal when the test register setup signal is high.

* * * * *